(12) United States Patent
Mizugaki et al.

(10) Patent No.: US 6,917,553 B2
(45) Date of Patent: Jul. 12, 2005

(54) SEMICONDUCTOR MEMORY DEVICE

(75) Inventors: Koichi Mizugaki, Suwa (JP); Eitaro Otsuka, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 4 days.

(21) Appl. No.: 10/770,404

(22) Filed: Feb. 4, 2004

(65) Prior Publication Data

US 2004/0165448 A1 Aug. 26, 2004

(30) Foreign Application Priority Data

Feb. 12, 2003 (JP) .................................... 2003-033532

(51) Int. Cl.[7] .............................................. G11C 7/00
(52) U.S. Cl. .............. 365/222; 365/230.06; 365/230.08
(58) Field of Search ................................. 365/222, 203, 365/230.06, 230.08, 189.01

(56) References Cited

U.S. PATENT DOCUMENTS 6,288,728 B1 * 9/2001 Satoh et al. ................. 345/519
6,336,180 B1 * 1/2002 Long et al. .................... 712/34
6,421,754 B1 * 7/2002 Kau et al. .................... 710/261
6,597,615 B2   7/2003 Mizugaki

FOREIGN PATENT DOCUMENTS

JP       a 2002-74945     3/2002

* cited by examiner

*Primary Examiner*—Gene N. Auduong
(74) *Attorney, Agent, or Firm*—Oliff & Berridge PLC

(57) ABSTRACT

In a semiconductor memory device equipped with a memory cell array in which dynamic memory cells are arrayed, for example, in a matrix, a technique speeds up of a read operation. In the read cycle, an external access controller outputs an external access execution timing signal which changes to active after the change of the output enable signal to active, and changes to inactive after a start of the latch of the read signal caused by changes of the latch signal to active and inactive. In the read cycle, the refresh controller outputs the refresh execution timing signal which changes to active according to the change of the latch signal to active while the refresh requirement signal is active, and stays active for a predetermined time period.

3 Claims, 9 Drawing Sheets

Fig.1

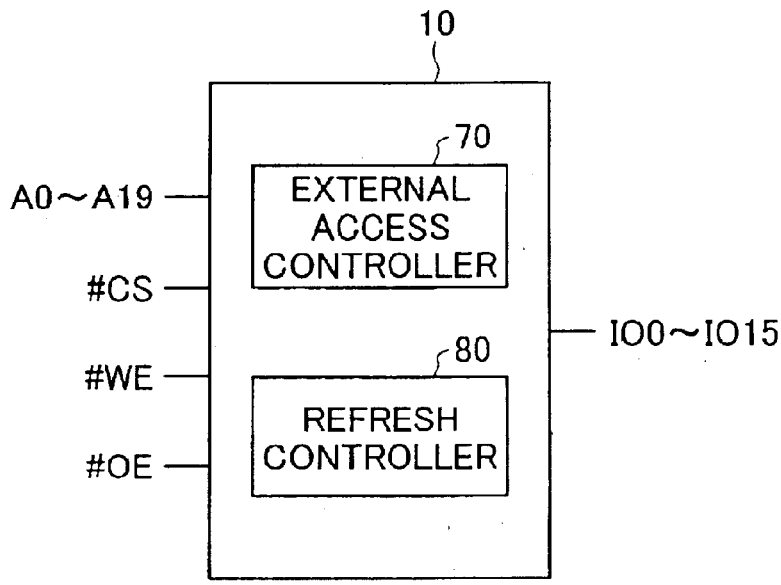

Fig.2

| | #CS | REFRESH MODE (*) |
|---|---|---|
| OPERATION | L | MODE 1 |
| STAND-BY | H | MODE 2 |

(*)

Refresh Mode 1: The refreshing operation starts synchronously with the output enable signal or the write enable signal after the generation of the refresh timing signal in the memory chip.

Refresh Mode 2: The refreshing operation starts according to the generation of the refresh timing signal in the memory chip (address input is not required).

SEMICONDUCTOR MEMORY DEVICE

BACKGROUND OF THE INVENTION

1. Field of the Invention

The present invention relates to a semiconductor memory device equipped with a memory cell array in which dynamic memory cells are arrayed, for example, in a matrix, and in particular to an apparatus that employs a technique for speeding up a read operation executed synchronously with an output enable signal supplied from an external device.

2. Description of Related Art

Typical examples of a semiconductor memory device include a DRAM and a SRAM. As is well known, the DRAM is more affordable in price and has a larger capacity than the SRAM, but requires a refreshing operation. The SRAM does not require any refreshing operation and is easily handled, but is more expensive and has a smaller capacity than the DRAM.

A virtual static RAM (called VSRAM) is a known semiconductor memory device having the advantages of the DRAM and the SRAM. The virtual SRAM (sometimes also called PSRAM, Pseudo Static RAM) has a memory cell array of dynamic memory cells like the DRAM, and includes a refresh controller to perform the internal refreshing operation synchronously with an output enable signal or a write enable signal supplied from an external device.

One example of techniques of a refresh control for a virtual SRAM is disclosed in JP2002-74945A.

It is preferable that a speed of reading data from a semiconductor memory device is high. The same is true for a virtual SRAM.

In a conventional virtual SRAM, a refreshing operation is executed in preference to a read access operation in a read operation cycle in which the reading of data from an external device (hereinafter referred to as 'read access' or simply 'access') is performed. Accordingly, the read access operation sometimes has to wait for the refreshing operation to be completed. This results in slowing down of an access speed in the read access operation. Hereinafter the read operation cycle is sometimes referred to as 'read cycle.' The write operation cycle, in which writing (hereinafter referred to as 'write access' or simply 'access') is performed, is sometimes referred to as 'write cycle.'

The present invention is made to address the above mentioned problem, and to provide apparatus and techniques which achieve speeding up of a read access in a semiconductor memory device equipped with a memory cell array, for example, in which dynamic memory cells, e.g., a virtual SRAM, are arrayed in a matrix.

SUMMARY OF THE INVENTION

In order to at least partially address the above mentioned problem, one embodiment of the present invention provides a first semiconductor memory device. The first semiconductor memory device has a memory cell array of dynamic memory cells; an external access controller which outputs an external access execution timing signal for indicating an execution timing of an access operation to the memory cell array; and a refresh controller which outputs a refresh execution timing signal for indicating an execution timing of a refreshing operation to the memory cell array. In the semiconductor memory device, an output enable signal supplied from an external device changes to active in a read cycle. A latch signal changes to active and then inactive to indicate latching a signal which is read from the memory cell array. In the read cycle, the external access execution timing signal changes to active triggered by the change of the output enable signal to active, and changes to inactive triggered by a start of the latch of the read signal caused by the changes of the latch signal to active and inactive. A refresh requirement signal changes to active to instruct an execution of the refreshing operation to the memory cell array. In the read cycle, the refresh execution timing signal changes to active according to the change of the latch signal to active while the refresh requirement signal is active, and stays active for a predetermined time period.

In the above first semiconductor memory device, in the read cycle, the external access execution timing signal changes to active immediately after the change of the output enable signal to active, and changes to inactive after a start of the latch of the read signal caused by the changes of the latch signal to active and inactive. In the read cycle, the refresh execution timing signal changes to active according to the change of the latch signal to active while the refresh requirement signal is active, and stays active for a predetermined time period. Accordingly, in the first memory device, the read access operation is executed in preference to the refreshing operation. Therefore the access speed of the first semiconductor memory device is higher than that of the memory device in which the refreshing operation is executed in preference to the read access operation.

In the above semiconductor first memory device, when the latch of the signal which is read starts, the external access execution timing signal changes to inactive, and the refresh execution timing signal changes to active and stays active for the predetermined time period. Consequently, in the read cycle, the refresh operation can be executed during the time period in which the read signal, which was latched, is obtained in the external device. Accordingly, the read cycle of the first memory device is shorter than that of the memory device in which the time period for the refresh operation is set independently in the read cycle.

In the first semiconductor memory device, a write enable signal supplied from an external device may change to active in a write cycle. In the write cycle, the refresh controller may output the refresh execution timing signal which changes to active according to a change of the write enable signal to active while the refresh requirement signal is active, and stays active for the predetermined time period. In the write cycle, the external access controller may output the external access execution timing signal which changes to active according to a return of the refresh execution timing signal to inactive; and a return to inactive according to a return of the write enable signal to inactive.

In this embodiment, even in the case where the read cycle starts after the end of the write cycle, the read access operation is executed in preference to the refreshing operation. Accordingly, the access speed of the first semiconductor memory device is higher than that of the memory device in which the refreshing operation is executed in preference to the read access operation.

As another embodiment of the present invention, a second semiconductor memory device has a memory cell array of dynamic memory cells; an external access controller which outputs an external access execution timing signal for indicating an execution timing of an access operation to the memory cell array; and a refresh controller which outputs a refresh execution timing signal for indicating an execution timing of a refreshing operation to the memory cell array. In the second semiconductor memory device, an output enable signal supplied from an external device changes to active in a read cycle. A latch signal changes to active and then inactive to indicate latching a signal which is read from the memory cell array. In the read cycle, the external access execution timing signal changes to active according to the change of the output enable signal to active; and changes to inactive according to a start of the latch of the read signal after the latch signal changes to active and inactive. A refresh requirement signal changes to active to instruct an execution of the refreshing operation to the memory cell array. In the read cycle, the refresh execution timing signal changes to active according to a return of the output enable signal to inactive while the refresh requirement signal is active; and stays active for a predetermined time period.

In the second semiconductor memory device, when the output enable signal returns to inactive, the refresh execution timing signal can immediately change to active and stay active for the predetermined time period, and the refresh operation can be executed. Accordingly, the access speed in the read cycle in the second semiconductor memory device is high.

The present invention may be embodied in a number of modes, such as, for example, a semiconductor memory device, a method for controlling a semiconductor memory device, and an electronic device including the semiconductor memory device.

These and other objects, features, aspects and advantages of the present invention will become more apparent from the following detailed description of preferred exemplary embodiments with the accompanying drawings.

BRIEF DESCRIPTION OF THE DRAWINGS.

FIG. 1 schematically illustrates the terminal structure of a memory chip in one embodiment of a semiconductor memory device of the present invention;

FIG. 2 shows the working status of the memory chip according to the signal levels of the chip select signal #CS;

DETAILED DESCRIPTION OF PREFERRED EMBODIMENTS

Figure 3:
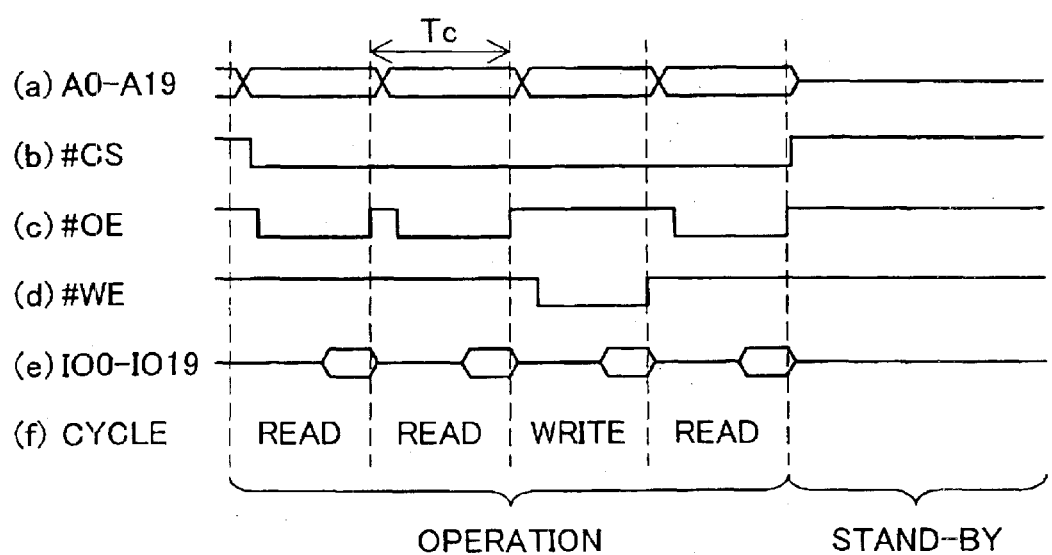
FIG. 3 is a timing chart showing the operations of the memory chip.

Preferred exemplary embodiments of the invention are described below.

A. Terminal Structure of Semiconductor Memory Device and Outline of Working Status FIG. 1 schematically illustrates the terminal structure of a memory chip 10 according to one embodiment of a semiconductor memory device of the present invention. The memory chip 10 has multiple terminals listed below:

A0 through A19: (20) Address input terminals

CS: Chip select input terminal

WE: Write enable input terminal

OE: Output enable input terminal (Output enable signal input terminal)

IO0 through IO15: (16) Input-output data terminals

In the description hereafter, an identical symbol is assigned commonly for both the terminal name and the signal name. The prefix '#' attached to the head of each terminal name (signal name) represents negative logic. Although there are multiple address input terminals A0 through A19 and multiple input-output data terminals IO0 through IO15, they are simplified in the illustration of FIG. 1. The other terminals which are not required for the explanation below, e.g., power terminal, are omitted from the illustration of FIG. 1.

The memory chip 10 is constructed as a virtual SRAM (VSRAM). Unlike the SRAM, however, the VSRAM uses dynamic memory cells and requires refreshing every predetermined time period (i.e., at predetermined time intervals). A refresh controller 80 described below is accordingly built in the memory chip 10 as well as an external access controller 70.

In the specification hereof, data reading and writing operations from an external device (a control device) executed via the external access controller are sometimes referred to as 'external access' or simply 'access.' A refreshing operation executed by the refresh controller is referred to as 'internal refresh' or simply 'refresh'. Refresh may be abbreviated as 'RF'.

Circuits in the memory chip 10 operate synchronously with an output enable signal #OE or a write enable signal #WE supplied from an external device. This memory chip 10 is a synchronous virtual SRAM.

The chip select signal #CS shown in FIG. 1 is used to regulate the working status of the memory chip 10. FIG. 2 shows the working status of the memory chip 10 according to the signal levels of the chip select signal #CS. In the specification hereof, 'level H' denotes a level '1', which is one of two levels of a binary signal, whereas 'level L' denotes a level '0', which is the other of the two levels of the binary signal.

When the chip select signal #CS is at the level L (active), the internal working status shifts to the operation mode, and a read operation cycle or a write operation cycle is carried out (hereinafter simply referred to as 'operation cycle' or 'read/write cycle'). In the operation cycle, external access is permitted, while internal refresh is executed at adequate timings.

When the chip select signal #CS is at the level H (inactive), the internal working status shifts to the stand-by mode. In the stand-by mode, external access is prohibited, and all word lines are inactivated. During the internal refresh, however, a specific word line specified by a refresh address generated by the refresh controller 80 is activated.

The refresh is executed in a first refresh mode in the operation cycle, and is executed in a second refresh mode in the stand-by cycle. In the first refresh mode, the refreshing operation starts synchronously with the output enable signal #OE or the write enable signal #WE after generation of a refresh timing signal in the refresh controller 80. In the second refresh mode, on the other hand, the refreshing operation starts immediately after generation of the refresh timing signal. The memory chip 10 executes refreshing in the suitable refresh mode corresponding to each of the two working statuses.

In the specification hereof, the expression that 'a certain signal (or pulse) is synchronous with the output enable signal or the write enable signal' is not restricted to generation of the certain signal (or pulse) at the same time as an edge of the output enable signal or the write enable signal, but means that the certain signal (or pulse) is generated with a fixed time relation to the edge of the output enable signal or the write enable signal.

The address data A0 through A19 shown in FIG. 1 is 20-bit data and specifies an address of 1 mega word. The input-output data IO0 through IO15 is 16-bit data corresponding to 1 word. Namely each value of the address A0 through A19 corresponds to 16 bits (1 word), and allows simultaneous input or output of the 16-bit input-output data IO0 through IO15.

In the operation mode, a write cycle is carried out, and input from the input-output data terminals IO0 through IO15 is allowed, when the output enable signal #OE is at the level H (inactive) and the write enable signal #WE is at the level L (active). A read cycle is carried out, and output from the input-output data terminals IO0 through IO15 is allowed, when the write enable signal #WE is at the level H (inactive) and the output enable signal #OE is at the level L (active).

FIG. 3 is a timing chart showing the operations of the memory chip 10. The current working status among the two working statuses (operation and stand-by modes) shown in FIG. 2 is specified at adequate timings according to variations in level of the chip select signal #CS indicated by the symbol (a) in FIG. 3.

In the first four cycles in FIG. 3, the chip select signal #CS is at the level L. Accordingly, the working status is in the operation mode and the operation cycle is carried out. In the operation mode, one of the read operation (read cycle) or the write operation (write cycle) is executed synchronously with the output enable signal #OE or the write enable signal #WE. FIG. 3 shows the status in which the read cycle is executed in the first, second and fourth cycles and the write cycle is executed in the third cycle.

A minimum period Tc of the output enable signal #OE corresponds to a cycle time (also referred to as 'cycle period') of this memory chip 10. The cycle time Tc is set, for example, in a range of about 50 ns to about 100 ns in the random access.

At the fourth cycle in FIG. 3, the chip select signal #CS has risen to the level H and is at the level H during and after the fourth cycle, so that the working status shifts to the stand-by mode at the fourth cycle.

B. Internal Structure of Semiconductor Memory Device

Figure 4:
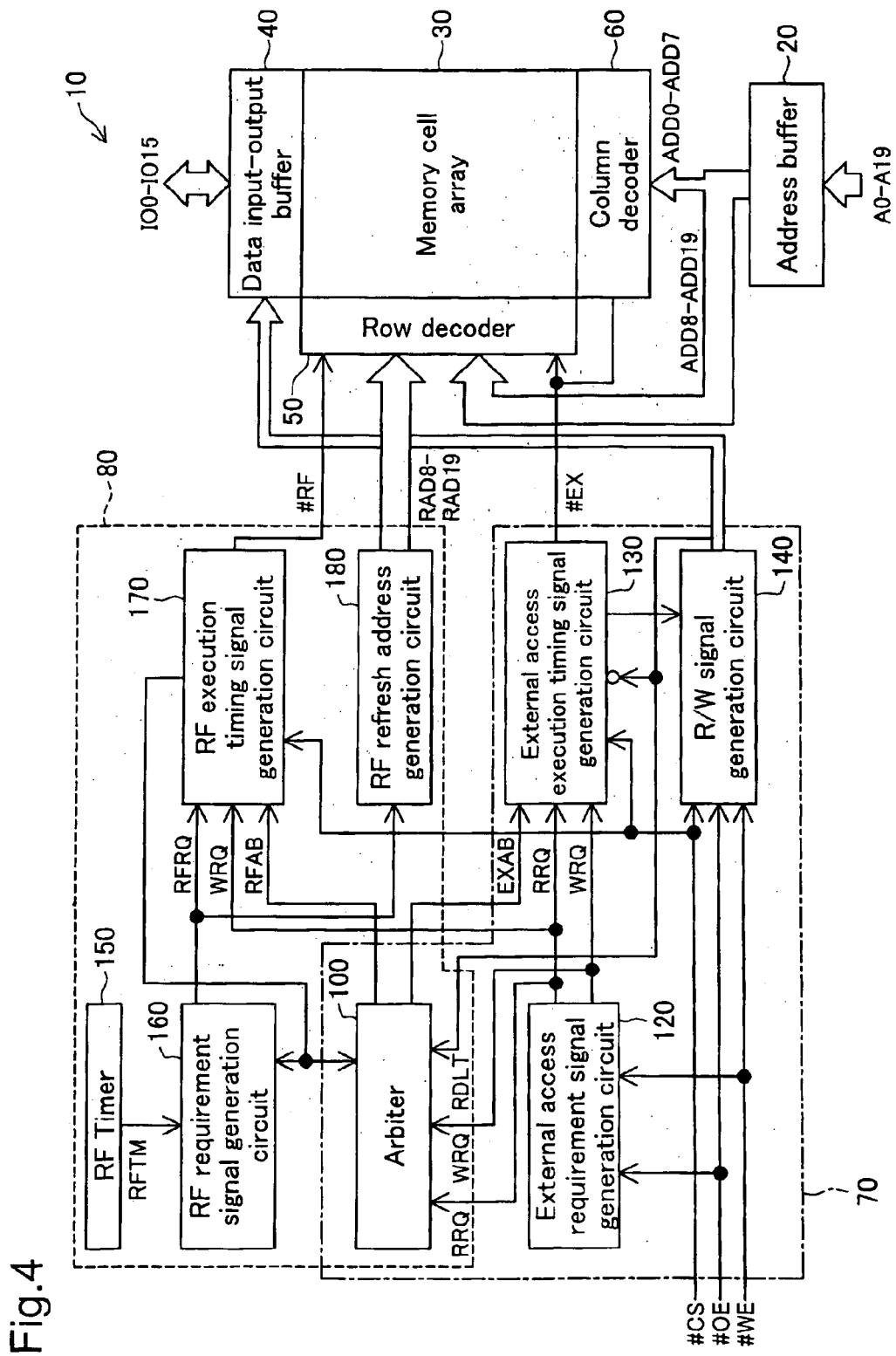
FIG. 4 is a block diagram illustrating the internal structure of the memory chip according to one embodiment of the invention.

FIG. 4 is a block diagram illustrating the internal structure of the memory chip 10. This memory chip 10 has an address buffer 20, a memory cell array 30, a data input-output buffer 40, a row decoder 50, a column decoder 60, the external access controller 70, and the refresh controller 80.

The structure of the memory cell array 30 is similar to that of a typical DRAM memory cell array. The memory cell array 30 has a plurality of one-transistor, one-capacitor-type memory cells arranged in a matrix. Each memory cell is connected with a non-illustrated word line and a non-illustrated bit line pair (also referred to as data line pair). In this embodiment, the plurality of memory cells are provided in a matrix of 4096 rows and 4096 columns (256×16 columns), i.e. 1 mega word (16 megabit).

The address buffer 20 is a circuit for supplying a plurality of addresses transmitted from an external device to the other internal circuits. In this embodiment, 20-bit addresses (external addresses) A0 through A19 are transmitted and supplied to other internal circuits as 20-bit internal addresses A0 through A19. Lower 8-bit internal addresses ADD0 through ADD7 are provided to the column decoder 60 as the column address, and upper 12-bit internal addresses ADD8 through ADD19 are provided to the row decoder 50 as the row address.

The row decoder 50 activates selected ones of the 4096 word lines in the memory cell array 30 according to the 12-bit row addresses ADD8 through ADD19 transferred from the address buffer 20 or the 12-bit refresh addresses RAD 8 through RAD 19 transferred from the refresh controller 80. The selection out of the row addresses ADD8 through ADD19 and the refresh addresses RAD 8 through RAD 19 is made according to an external access execution timing signal #EX transferred from the external access controller 70 and the refresh execution timing signal #RF transferred from the refresh controller 80.

The column decoder 60 simultaneously selects bit line pairs of 1 word (16 bits) among multiple bit line pairs in the memory cell array 30 according to a given column address from the addresses ADD0 through ADD7. The selection of the bit line pairs by the column decoder 60 is executed based on the external access execution timing signal #EX.

Accordingly, the memory cells of 1 word (16 bits) are selected from the memory cell array 30 including the memory cells of 1 mega word (16 megabit) based on the 12-bit row addresses ADD8 through ADD19 and the 8-bit column addresses ADD0 through ADD7.

Data of 1 word corresponding to the selected memory cells are read or written via the data input-output buffer 40. The external device gains simultaneous access to the memory cells of 1 word in the memory cell array 30 by input of one address A0 through A19 to the memory chip 10. The data input-output buffer 40 includes a non-illustrated reading circuit and a non-illustrated writing circuit and allows data transmission between the data input-output buffer 40 and the memory cell array 30. The memory cell array 30 or the data input-output buffer 40 also includes non-illustrated other constituents, such as a pre-charge circuit, a sense amplifier, a preamplifier, a latch circuit for read data, and a data writing circuit.

The external access controller 70 has an arbiter 100, an external access requirement signal generation circuit 120, an external access execution timing signal generation circuit 130, and an R/W signal generation circuit 140.

The arbiter 100 generates an external access arbiter signal EXAB based on a read access requirement signal RRQ and a write access requirement signal WRQ.

The external access requirement signal generation circuit 120 generates (1) the read access requirement signal RRQ synchronously with the output enable signal #OE and (2) the write access requirement signal WRQ synchronously with the write enable signal #WE.

In the operation mode in which the chip select signal #CS is active, the external access execution timing signal generation circuit 130 outputs the external access execution timing signal #EX based on (1) the external access arbiter signal EXAB supplied from the arbiter 100, (2) the read access requirement signal RRQ and the write access requirement signal WRQ supplied from the external access requirement signal generation circuit 120, and (3) a read latch signal RDLT supplied from the R/W signal generation circuit 140. The external access execution timing signal generation circuit 130 controls the operation of the row decoder 50 and the column decoder 60 by the external access execution timing signal #EX. Whereas in the stand-by mode in which the chip select signal #CS is inactive, the external access execution timing signal #EX is not output.

The R/W signal generation circuit 140 outputs signals for controlling input/output of data executed via the data input-output buffer 40. The signals are output based on the chip select signal #CS, the write enable signal #WE, and the output enable signal #OE. The R/W signal generation circuit 140 controls the reading of data from the memory cell array 30 or the writing of data to the memory cell array 30. For example, the R/W signal generation circuit 140 outputs the read latch signal RDLT to be supplied to the arbiter 100 and the external access execution timing signal generation circuit 130.

The refresh controller 80 has a refresh timer 150, a refresh requirement signal generation circuit 160, a refresh execution timing signal generation circuit 170, and a refresh address generation circuit 180. The arbiter 100 also is included in the external access controller 70, and, as described above, is one of the elements of the refresh controller 80.

The arbiter 100 outputs an refresh arbiter signal RFAB based on the write access requirement signal WRQ and the read latch signal RDLT.

The refresh timer 150 outputs a pulse signal, as a refresh timing signal RFTM, which is activated for a predetermined time period at regular time intervals of the refresh cycle. The refresh timer 150 may be constructed as a ring oscillator, for example.

The refresh requirement signal generation circuit 160 outputs the refresh requirement signal RFRQ synchronously with the refresh timing signal RFTM supplied from the refresh timer 150.

In the operation mode in which the chip select signal #CS is active (level L), the refresh execution timing signal generation circuit 170 outputs the refresh execution timing signal #RF based on (1) the refresh requirement signal RFRQ supplied from the refresh requirement signal generation circuit 160, (2) the refresh arbiter signal RFAB supplied from the arbiter 100, and (3) the write access requirement signal WRQ supplied from the external access requirement signal generation circuit 120. In the stand-by mode in which the chip select signal #CS is inactive (level H), the refresh execution timing signal generation circuit 170 outputs the refresh execution timing signal #RF based on (1) the refresh requirement signal RFRQ.

The refresh address generation circuit 180 outputs 12-bit refresh addresses RAD8 through RAD19 according to the refresh requirement signal RFRQ. The refresh address generation circuit 180 may be constructed with a 12-bit counter, for example.

Each of the blocks included in the external access controller 70 and the refresh controller 80 can be constructed easily using a diversity of ordinary logical circuits which realize each function described below. Therefore, their explanation is omitted.

C. The First Example

Practical operations of the external access controller 70 and the refresh controller 80 in the operation mode are described hereinbelow, in the following order: (1) Case where the read cycles are executed in succession; and (2) Case where the read cycle is executed after the write cycle.

Whereas in the stand-by mode, when the refresh requirement signal RFRQ changes to the level H (active) synchronously with the change of the refresh timing signal RFTM to the level H (active), the refresh execution timing signal #RF changes immediately to the level L (active) and stays at the level L for a predetermined time period, and the refreshing operation is executed.

C1. Case where the Read Cycles are Executed in Succession

C1.1 Embodiment

Figure 5:
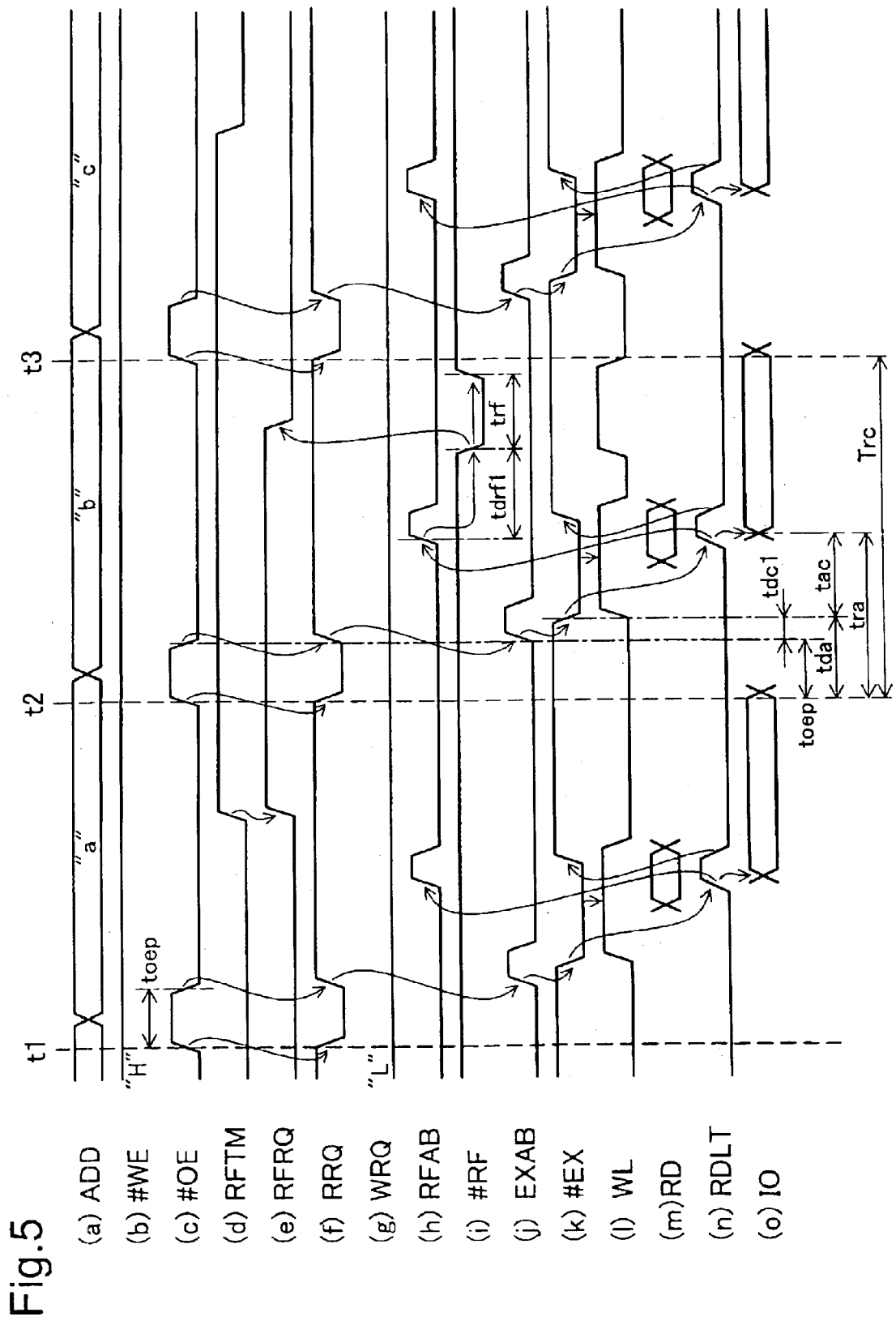
FIG. 5 shows the timing chart for each signal in the case where the read cycles are executed in succession.

FIG. 5 shows the timing chart for each signal in the case where the read cycles are executed in succession.

The cycle between times t1 and t2 in FIG. 5 is the cycle where the refreshing operation is not executed. The cycle between times t2 and t3 is the cycle where the refreshing operation is executed.

In the read cycle, the write enable signal #WE (indicated by the symbol (b) in FIG. 5) is at the level H (inactive). The output enable signal #OE (indicated by the symbol (c) in FIG. 5) changes to the level H (inactive) at the time of starting of each cycle and then goes back to the level L (active) at the expiration of a predetermined time period toep. The time period toep is set for avoiding the confusion by address skew on an external address ADD. The time period toep is usually decided based on the set-up time and the hold time associated with the estimated changing time of the address ADD.

The cycle between times t1 and t2 is described hereinbelow. When the output enable signal #OE changes to the level H at the time t1, the read access requirement signal RRQ (indicated by the symbol (f) in FIG. 5) changes to the level L (inactive) consequently. When the output enable signal #OE changes to the level L after the expiration of the predetermined time period toep after the change of the output enable signal #OE to the level H, the read access requirement signal RRQ changes to the level H (active) consequently. The write access requirement signal WRQ (indicated by the symbol (g) in FIG. 5) varies synchronously with the write enable signal #WE. In this situation, the write enable signal #WE (indicated by the symbol (b) in FIG. 5) keeps the level H (inactive). Accordingly, the write access requirement signal WRQ also keeps the level L (inactive).

When the read access requirement signal RRQ changes to the level H, the external access arbiter signal EXAB (indicated by the symbol (j) in FIG. 5) changes to the level H (active) consequently. When the external access arbiter signal EXAB changes to the level H, the external access execution timing signal #EX (indicated by the symbol (k) in FIG. 5) changes from the level H (inactive) to the level L (active) consequently. When the external access execution timing signal #EX changes to the level L, a word line WL corresponding to the external address ADD (A0 through A19, indicated by the symbol "a") indicated by the symbol (a) in FIG. 5 is activated as shown by symbol (l) in FIG. 5, and the read signal RD (indicated by the symbol (m) in FIG. 5) is output. In FIG. 5, a plurality of the signals of the word line WL are shown as one signal line (indicated by the symbol (l) in FIG. 5) for simplicity of explanation. The same is true in the timing charts used in the explanation below.

At a specific timing when the read signal RD can be output stably, a pulse signal which changes to the level H according to the change of the external access execution timing signal #EX to the level L is output as the read latch signal RDLT (indicated by the symbol (n) in FIG. 5). The read latch signal RDLT is a latch signal which changes to the level H at a specific timing when the read signal RD can be output stably to cause sampling of the read signal RD, and then changes to the level L to cause latching of the sampled read signal RD.

When the read latch signal RDLT changes to the level H and the latch of the read signal RD starts, the external access execution timing signal #EX (indicated by the symbol (k) in FIG. 5) changes to the level H (inactive) consequently. When the external access execution timing signal #EX changes to the level H, the word line WL that has been activated is inactivated and reading from the selected memory cell ends. However, the read signal RD has already been latched. Accordingly, the latched read signal RD is output as an output data signal IO (IO0 through IO15) (indicated by the symbol (o) in FIG. 5) for a time period in which the output enable signal #OE stays at the level L. Based on the signal, the read access to the memory cell corresponding to the external address ADD (indicated by the symbol "a") is executed.

The refresh arbiter signal RFAB (indicated by the symbol (h) in FIG. 5) is a pulse signal that changes to the level H according to the change of the read latch signal RDLT to the level H. The refresh timing signal RFTM has not changed to the level H (active) in the non-illustrated cycle before the time t1, and consequently the refresh requirement signal RFRQ (indicated by the symbol (e) in FIG. 5) has not changed to the level H (active). Accordingly, the refresh requirement signal RFRQ keeps the level L even when the refresh arbiter signal RFAB changes to the level H. Consequently, the refresh execution timing signal #RF (indicated by the symbol (i) in FIG. 5) stays at the level H (inactive) and the refresh is not executed in the cycle between the times t1 and t2.

The cycle between times t2 and t3 is described hereinbelow. In the cycle between the times t2 and t3, the external access execution timing signal #EX changes to the level L at the same timing with the cycle between the times t1 and t2. Then the read access to the memory cell corresponding to the external address ADD (indicated by the symbol "b") is executed.

The refresh timing signal RFTM (indicated by the symbol (d) in FIG. 5) changes to the level H in the cycle between times t1 and t2. Consequently, the refresh requirement signal RFRQ (indicated by the symbol (e) in FIG. 5) changes to the level H. Accordingly, in the cycle between times t2 and t3, the refresh requirement signal RFRQ is at the level H, when the refresh arbiter signal RFAB changes to the level H. The refresh execution timing signal #RF (indicated by the symbol (i) in FIG. 5) changes to the level L (active) after the expiration of the predetermined time period tdrf1 after the change of the refresh arbiter signal RFAB to the level H. Then the refresh execution timing signal #RF stays at the level L for the predetermined time period trf. Consequently, a word line WL corresponding to a non-illustrated refresh address RADD (RAD8 through RAD19) is activated and the refreshing operation of the memory cell selected based on the word line WL is executed.

When the refresh execution timing signal #RF changes to the level L, the refresh requirement signal RFRQ changes to the level L (inactive) consequently, and the refresh requirement is released.

The predetermined time period tdrf1 is preferably determined so that the time period, from the timing when the external access execution timing signal #EX changes to the level H to the timing when the refresh execution timing signal #RF changes to the level L, becomes equal to or longer than the required pre-charge time. In other words, the predetermined time period tdrf1 is preferably determined so that the time period, from the timing when the inactivation of the word line that has been activated in the read access operation starts to the timing when the activation of the word line to be selected in the refreshing operation starts, becomes equal to or longer than the required pre-charge time. "The pre-charge time" means the time period from the time when the inactivation of the word line that has been activated starts to the time when the activation of any word line starts. The pre-charge time is determined based on the structure of the virtual SRAM as the waiting time.

In the cycle from time t3, the refresh requirement signal RFRQ is at the level L. Consequently, the refreshing operation is not executed and the memory chip 10 functions the same as for the cycle between times t1 and t2.

As described above, the refreshing operation in the read cycle is executed after the preferential execution of the read access.

Where the starting time of the read access is fixed as the timing when the output enable signal #OE changes to the level H (inactive), the access time tra, from the starting time to the time when the output data signal IO is output, is expressed with the following formula (1) regardless of execution of the refreshing operation.

$$tra = tda + tac \quad (1)$$

The parameter tda is a waiting time from the time when the output enable signal #OE changes to the level H to the time when the external access execution timing signal #EX changes to the level L. The parameter tac is a time period from the time when the external access execution timing signal #EX changes to the level L and the actual read access starts to the time when the output data signal IO is output. The waiting time tda is expressed with the following formula (2).

$$tda = toep + tdc1 \quad (2)$$

The parameter toep shows a time period from the change of the output enable signal #OE to the level H to the subsequent change of the output enable signal #OE to the level L. The parameter tdc1 shows a delay time of a logical circuit to generate the external access execution timing signal #EX.

C1.2 COMPARATIVE EXAMPLE

Figure 6:
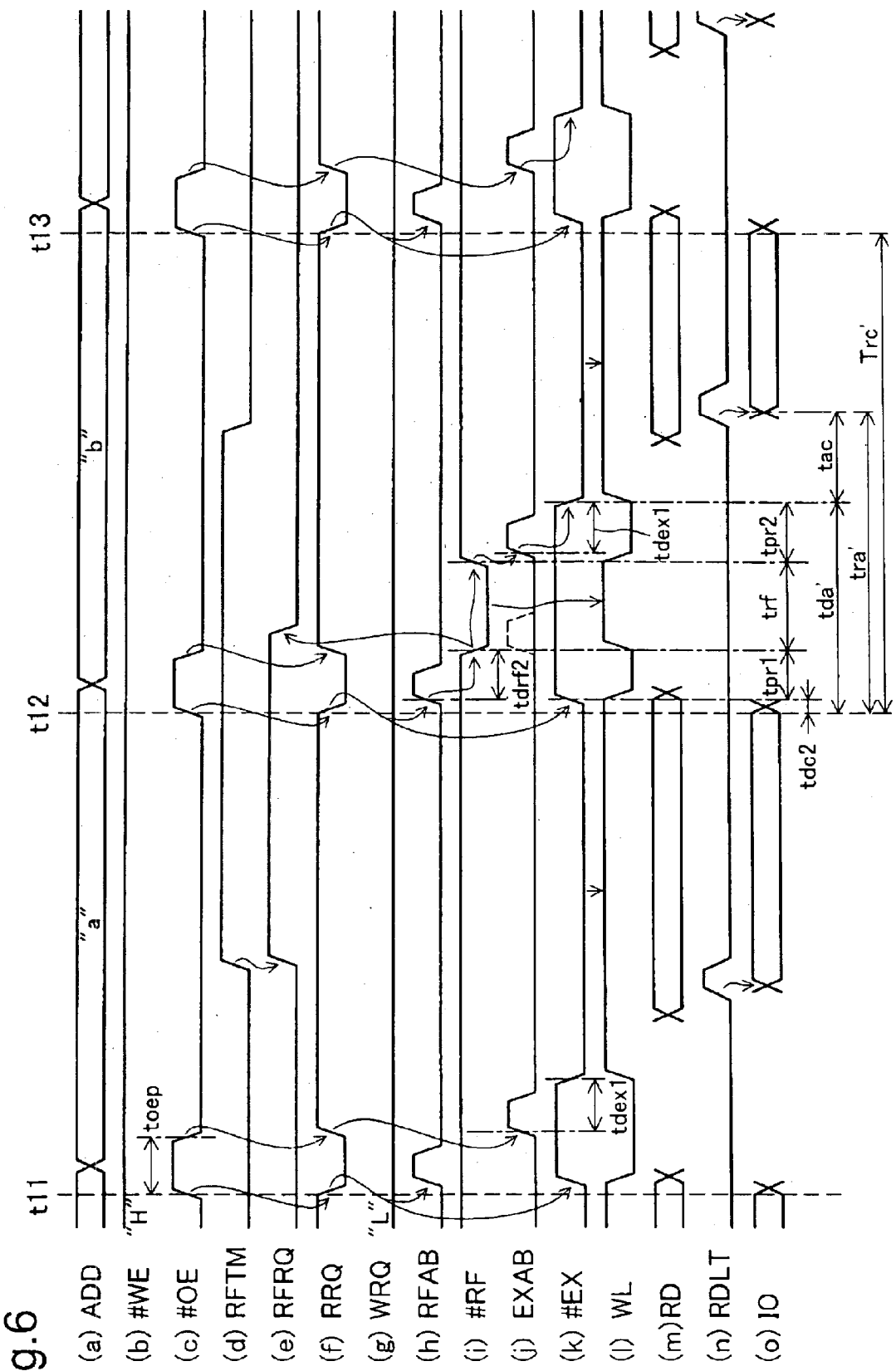
FIG. 6 shows the timing chart for each signal of a comparative example in the case where the read cycles are executed in succession.

A comparative example is described to demonstrate the effect of the above described embodiment. FIG. 6 shows the timing chart for each signal of a comparative example in the case where the read cycles are executed in succession.

The cycle between times t11 and t12 in FIG. 6 is a cycle where the refreshing operation is not executed. The cycle between times t12 and t13 is a cycle where the refreshing operation is executed.

In the comparative example, in the read cycle, the write enable signal #WE (indicated by the symbol (b) in FIG. 6) is at the level H (inactive). The output enable signal #OE (indicated by the symbol (c) in FIG. 6) changes to the level H (inactive) at the time of starting of each cycle and then goes back to the level L (active) at the expiration of a predetermined time period toep.

The cycle between times t11 and t12 is described hereinbelow. When the output enable signal #OE changes to the level H at the time t11, the read access requirement signal RRQ (indicated by the symbol (f) in FIG. 6) changes to the level L (inactive) consequently.

When the read access requirement signal RRQ changes to the level L, the external access execution timing signal #EX (indicated by the symbol (k) in FIG. 6) changes to the level H, if the external access execution timing signal #EX was at the level L in the preceding cycle. When the read access requirement signal RRQ changes to the level L, the refresh arbiter signal RFAB (indicated by the symbol (h) in FIG. 6) changes to the level H (active) consequently. When the refresh arbiter signal RFAB changes to the level H, the refresh execution timing signal #RF (indicated by the symbol (i) in FIG. 6) stays at the level H (inactive), if the refresh requirement. signal RFRQ (indicated by the symbol (e) in FIG. 6) is at the level L.

When the output enable signal #OE changes to the level L after the expiration of the predetermined time period toep after the change of the output enable signal #OE to the level H, the read access requirement signal RRQ (indicated by the symbol (f) in FIG. 6) changes to the level H (active) consequently. The write access requirement signal WRQ (indicated by the symbol (g) in FIG. 6) varies synchronously with the write enable signal #WE. In this situation, the write enable signal #WE stays at the level H (inactive). Accordingly, the write access requirement signal WRQ also stays at the level L (inactive).

When the read access requirement signal RRQ changes to the level H, the external access arbiter signal EXAB (indicated by the symbol (j) in FIG. 6) changes to the level H (active) consequently. When the external access arbiter signal EXAB changes to the level H, the external access execution timing signal #EX (indicated by the symbol (k) in FIG. 6) changes to the level L (active) after the expiration of the predetermined time period tdex1 after the change of the external access arbiter signal EXAB to the level H. The predetermined time period tdex1 is described below. The external access execution timing signal #EX stays at the level L until the read access requirement signal RRQ changes to the level L according to the change of the output enable signal #OE to the level H at the time t12. When the external access execution timing signal #EX changes to the level L, a word line WL corresponding to the external address ADD (A0 through A19, indicated by the symbol "a") indicated by the symbol (a) in FIG. 6 is activated as shown by symbol (l) in FIG. 6, and the read signal RD (indicated by the symbol (m) in FIG. 6) is output.

At a specific timing when the read signal RD can be output stably, a pulse signal which changes to the level H according to the change of the external access execution timing signal #EX to the level L is output as the read latch signal RDLT (indicated by the symbol (n) in FIG. 6). When the read latch signal RDLT changes to the level H and the read signal RD is sampled and then latched, the latched read signal RD is output as an output data signal IO (IO0 through IO15) (indicated by the symbol (o) in FIG. 6) for a time period in which the output enable signal #OE stays at the level L. Based on the signal, the read access to the memory cell corresponding to the external address ADD (indicated by the symbol "a") is executed.

The cycle between times t12 and t13 is described hereinbelow. The refresh timing signal RFTM (indicated by the symbol (d) in FIG. 6) changes to the level H in the cycle between times t11 and t12. Consequently, the refresh requirement signal RFRQ (indicated by the symbol (e) in FIG. 6) changes to the level H. Accordingly, in the cycle between times t12 and t13, the refresh requirement signal RFRQ is at the level H, when the refresh arbiter signal RFAB changes to the level H. The refresh execution timing signal #RF (indicated by the symbol (i) in FIG. 6) changes to the level L (active) after the expiration of the predetermined time period tdrf2 after the change of the refresh arbiter signal RFAB to the level H. Then the refresh execution timing signal #RF stays at the level L for the predetermined time period trf. Consequently, a word line WL corresponding to a non-illustrated refresh address RADD (RAD8 through RAD19) is activated and the refreshing operation of the memory cell selected based on the word line WL is executed.

When the refresh execution timing signal #RF changes to the level L, the refresh requirement signal RFRQ (indicated by the symbol (e) in FIG. 6) changes to the level L (inactive), and the refresh requirement is released.

The predetermined time period tdrf2 is preferably determined so that the time period, from the timing when the external access execution timing signal #EX changes to the level H to the timing when the refresh execution timing signal #RF changes to the level L, becomes equal to or longer than the required pre-charge time. In other words, the predetermined time period tdrf1 is preferably determined so that the time period, from the timing when the inactivation of the word line that has been activated in the read access operation starts in the precedent cycle to the timing when the activation of the word line to be selected in the read access operation starts, becomes equal to or longer than the required pre-charge time.

In the case where the refreshing operation is not executed in the cycle between the times t11 and t12, when the read access requirement signal RRQ changes to the level H according to the change of the output enable signal #OE to the level L, the external access arbiter signal EXAB (indicated by the broken line with the symbol (j) in FIG. 6) changes to the level H consequently. However, in the case where the refreshing operation is executed, the change of the external access arbiter signal EXAB to the level H is masked because the refresh execution timing signal #RF changed to the level L when the refresh requirement signal RFRQ is at the level H. Then the external access arbiter signal EXAB (indicated by the symbol (j) in FIG. 6) changes to the level H after the refresh execution timing signal #RF has returned to the level H.

When the external access arbiter signal EXAB changes to the level H, the external access execution timing signal #EX (indicated by the symbol (k) in FIG. 6) changes to the level L (active) after the expiration of the predetermined time period tdex1 after the change of the external access arbiter signal EXAB to the level H. When the external access execution timing signal #EX changes to the level L, a word line WL corresponding to the external address ADD (A0 through A19, indicated by the symbol "b") indicated by the symbol (a) in FIG. 6 is activated as shown by symbol (l) in FIG. 6, and the read signal RD (indicated by the symbol (m) in FIG. 6) is output. Due to the read signal RD, the read access to the memory cell corresponding to the external address ADD (indicated by the symbol "b") is executed.

The predetermined time period tdex1 is preferably determined so that the time period, from the time when the refresh execution timing signal #RF changes to the level H to the time when the external access execution timing signal #EX changes to the level L, becomes equal to or longer than the required pre-charge time. In other words, the predetermined time period tdex1 is preferably determined so that the time period, from the time when the inactivation of the word line that has been activated in the refresh access operation starts to the time when the activation of the word line to be selected in the read access operation starts, becomes equal to or longer than the required pre-charge time.

In the cycle from time t13, the refresh requirement signal RFRQ is at the level L. Consequently, the refreshing operation is not executed and the memory chip 10 functions the same as the cycle between times t11 and t12.

As described above, in the comparative example, the refreshing operation in the read cycle is executed in preference to the read access.

Where the starting time of the read access is fixed as the timing when the output enable signal #OE changes to the level H (inactive), the access time tra', from the starting time of the read access to the time when the output data signal IO is output, is extended by the time period for the refreshing operation compared to the case where the refreshing operation is not executed. The access time tra' is expressed with the following formula (3).

$$tra'=tda'+tac \quad (3)$$

The parameter tda' is a waiting time from the time when the output enable signal #OE changes to the level H to the time when the external access execution timing signal #EX changes to the level L. The parameter tac is a time period from the time when the external access execution timing signal #EX changes to the level L to the time when the output data signal IO is output. The waiting time tda' is expressed with the following formula (4).

$$tda'=tdc2+tpr1+trf+tpr2 \quad (4)$$

The parameter tdc2 shows a delay time of a logical circuit to generate the external access execution timing signal #EX. The parameter tpr1 shows a time period from the change of the external access execution timing signal #EX to the level H to the change of the refresh execution timing signal #RF to the level L, which corresponds to the pre-charge time. The code trf shows a time period in which the refresh execution timing signal #RF stays at the level L, which corresponds to the refresh period. The parameter tpr2 shows a time period from the change of the refresh execution timing signal #RF to the level H to the change of the external access execution timing signal #EX to the level L, which corresponds to the pre-charge time.

C1.3 Comparison of Access Speed

The difference Δtra between the access time tra of the embodiment expressed by the formula (1) and the access time tra' of the comparative example expressed by the formula (3) is expressed by the difference between the waiting time tda and the waiting time tda' as shown in the following formula (5).

$$\Delta tra=tda'-tda=(tdc2+tpr1+trf+tpr2)-(toep+tdc1) \quad (5)$$

Generally, the lengths of the delay times tdc1 and tdc2 of the logical circuit can be considered to be the same, or can be ignored because the length of each of these delay times is much smaller than other time periods. Thus, the formula (5) can be expressed by the following formula (5a).

$$\Delta tra=tda'-tda \approx (tpr1+trf+tpr2)-toep \quad (5a)$$

In the case where the time period toep from the change of the output enable signal #OE to the level H to the subsequent change to the level L is sufficiently large, i.e., toep>(tpr1+ trf+tpr2), the waiting time tda' of the comparative example expressed by the formula (4) is nearly equal to the waiting time tda of the embodiment expressed by the formula (2). In this case, the access time tra' of the comparative example is nearly equal to the access time tra of the embodiment expressed by the formula (1). Accordingly, the difference Δtra is not produced.

However, for a shortened cycle time, toep in the comparative example is generally smaller than (tpr1+trf+tpr2), i.e., toep<(tpr1+trf+tpr2).

Accordingly, the access time tra of the embodiment expressed by the formula (1) is smaller than the access time tra' of the comparative example expressed by the formula (3) by Δtra expressed by the formula (5a). Consequently, the memory chip 10 of the embodiment achieves a fast read access in the case where the read cycles are executed in succession. Furthermore, the memory chip 10 of the embodiment achieves a shortening of the cycle time in the case where the read cycles are executed in succession.

C2. Case where the Read Cycle is Executed After the Write Cycle

C2.1 Embodiment

Figure 7:
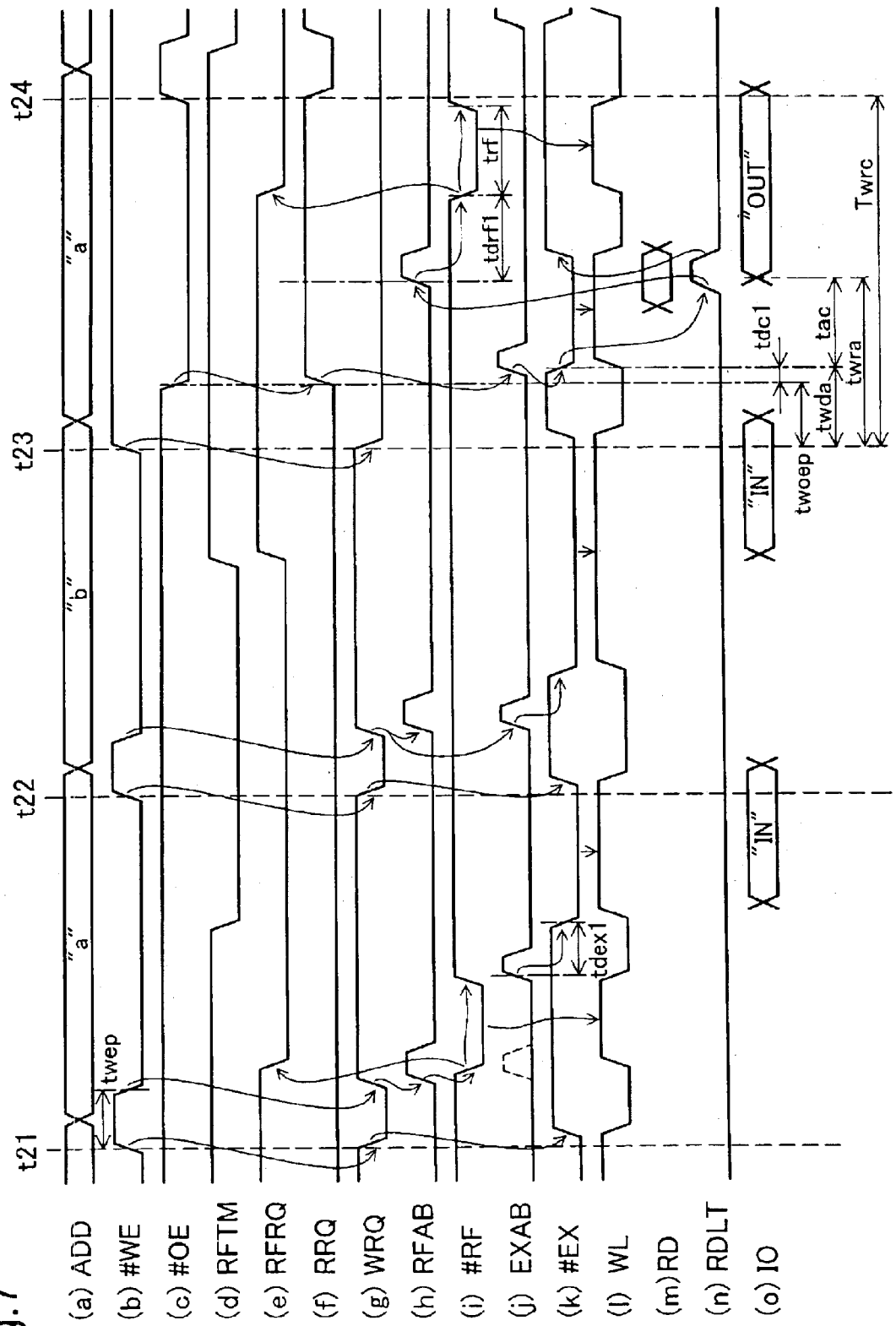
FIG. 7 shows the timing chart for each signal in the case where the read cycle is executed after the write cycle.

FIG. 7 shows the timing chart for each signal in the case where the read cycle is executed after the write cycle.

The cycle between times t21 and t22 in FIG. 7 is the write cycle where the refreshing operation is executed. The cycle between times t22 and t23 is the write cycle where the refreshing operation is not executed. The cycle between times t23 and t24 is the read cycle where the refreshing operation is executed.

In the write cycle, the output enable signal #OE (indicated by the symbol (c) in FIG. 7) is at the level H (inactive). The write enable signal #WE (indicated by the symbol (b) in FIG. 7) changes to the level H (inactive) at the time of starting of each cycle and then goes back to the level L (active) at the expiration of a predetermined time period twep. The time period twep is set for avoiding the confusion by address skew on an external address ADD. The time period twep is usually decided based on the set-up time and the hold time associated to the estimated changing time of the address ADD.

The cycle between times t21 and t22 is described hereinbelow. When the write enable signal #WE changes to the level H at the time t21, the write access requirement signal WRQ (indicated by the symbol (g) in FIG. 7) changes to the level L (inactive) consequently. When the write enable signal #WE changes to the level L after the expiration of the predetermined time period twep after the change of the write enable signal #WE to the level H, the write access requirement signal WRQ changes to the level H (active) consequently. The output enable signal #OE (indicated by the symbol (c) in FIG. 7) stays at the level H (inactive). Accordingly, the read access requirement signal RRQ (indicated by the symbol (f) in FIG. 7) also stays at the level L (inactive).

When the write access requirement signal WRQ changes to the level H, the refresh arbiter signal RFAB (indicated by the symbol (h) in FIG. 7) changes to the level H (active) consequently.

In the non-illustrated cycle before the time t21, the refresh timing signal RFTM (indicated by the symbol (d) in FIG. 7) has changed to the level H (active), and the refresh requirement signal RFRQ (indicated by the symbol (e) in FIG. 7) has also changed to the level H (active) consequently. If the refresh requirement signal RFRQ (indicated by the symbol (e) in FIG. 7) is at the level H when the refresh arbiter signal RFAB changes to the level H, the refresh execution timing signal #RF (indicated by the symbol (i) in FIG. 7) changes to the level L (active) according to the change of the refresh arbiter signal RFAB to the level H and stays at the level L for the predetermined time period trf. Consequently, a word line WL corresponding to a non-illustrated refresh address RADD (RAD8 through RAD19) is activated and the refreshing operation of the memory cell selected based on the word line WL is executed.

When the refresh execution timing signal #RF changes to the level L, the refresh requirement signal RFRQ (indicated by the symbol (e) in FIG. 7) changes to the level L (inactive), and the refresh requirement is released.

In the case where the refreshing operation is not executed, when the write access requirement signal WRQ (indicated by the broken line with the symbol (g) in FIG. 7) changes to the level H, the external access arbiter signal EXAB (indicated by the broken line with the symbol (j) in FIG. 7) also changes to the level H consequently. However, in the case where the refreshing operation is executed, the change of the external access arbiter signal EXAB to the level H is masked because the refresh execution timing signal #RF changed to the level L when the refresh requirement signal RFRQ is at the level H. Then the external access arbiter signal EXAB (indicated by the symbol (j) in FIG. 7) changes to the level H after the refresh execution timing signal #RF returns to the level H.

When the external access arbiter signal EXAB changes to the level H, the external access execution timing signal #EX (indicated by the symbol (k) in FIG. 7) changes to the level L (active) consequently after the expiration of the predetermined time period tdex1 after the change of the external access arbiter signal EXAB to the level H. The external access execution timing signal #EX stays at the level L until the write access requirement signal WRQ changes to the level L according to the change of the write enable signal #WE to the level H at the time t22.

When the external access execution timing signal #EX changes to the level L, a word line WL corresponding to the external address ADD (A0 through A19, indicated by the symbol "a") indicated by the symbol (a) in FIG. 7 is activated as shown by symbol (l) in FIG. 7. Then the input data signal IO (IO0 through IO15) (indicated by the symbol (o) in FIG. 7) is written to the memory cell corresponding to the external address ADD (indicated by the symbol "a") at the timing of the change of the write enable signal #WE to the level H at the time t22.

The cycle between times t22 and t23 is described hereinbelow. In the cycle between times t22 and t23, the refresh requirement signal RFRQ stays at the level L when the refresh arbiter signal RFAB changes to the level H. Accordingly, the refreshing operation is not executed. Consequently, the write enable signal #WE (indicated by the symbol (b) in FIG. 7) changes to the level H at the time t22, and then changes to the level L after expiration of the predetermined time period twep. Then the write access requirement signal WRQ (indicated by the symbol (g) in FIG. 7) changes to the level L. Then the external access arbiter signal EXAB (indicated by the symbol (j) in FIG. 7) changes to the level H according to the change of the write access requirement signal WRQ to the level H. When the external access arbiter signal EXAB changes to the level H, the external access execution timing signal #EX (indicated by the symbol (k) in FIG. 7) changes to the level L after the expiration of the predetermined time period tdex1 after the change of the external access arbiter signal EXAB to the level H. Consequently, the write access to the memory cell corresponding to the external address ADD (indicated by the symbol "b") is executed.

In the cycle between the times t23 and t24, the write enable signal #WE is at the level H (inactive), and the output enable signal #OE stays at the level L (active) from the time t23 for a predetermined time period twoep. Consequently, the read access is executed.

The refresh timing signal RFTM (indicated by the symbol (d) in FIG. 7) changes to the level H in the cycle between times t22 and t23. Consequently, the refresh requirement signal RFRQ (indicated by the symbol (e) in FIG. 7) changes to the level H. Accordingly, in the cycle between times t23 and t24, the refresh requirement signal RFRQ is at the level H, when the refresh arbiter signal RFAB (indicated by the symbol (h) in FIG. 7) changes to the level H. Consequently, in the cycle between times t23 and t24, the refreshing operation is executed after the execution of the read access operation as in the cycle between times t2 and t3 in FIG. 5.

The operation timings in the read cycle are the same as those of the cycle between times t2 and t3 in FIG. 5. Therefore, their explanation is omitted.

Where the starting time of the read access is fixed as the timing when the write enable signal #WE changes to the level H (inactive), the access time twra, from the starting time to the time when the output data signal IO is output, is similar to the formula (1) and is expressed with the following formula (7).

$$twra = twda + tac \qquad (7)$$

The parameter twda is a waiting time from the time when the write enable signal #WE changes to the level H to the time when the external access execution timing signal #EX changes to the level L. The parameter tac is a time period from the time when the external access execution timing signal #EX changes to the level L to the time when the output data signal IO is output. The waiting time twda is expressed with the following formula (8).

$$twda = twoep + tdc1 \qquad (8)$$

The parameter twoep shows a time period from the change of the write enable signal #WE to the level H (inactive) to the subsequent change of the output enable signal #OE to the level L. The parameter tdc1 shows a delay time of a logical circuit to generate the external access execution timing signal #EX.

C2.2 COMPARATIVE EXAMPLE

Figure 8:
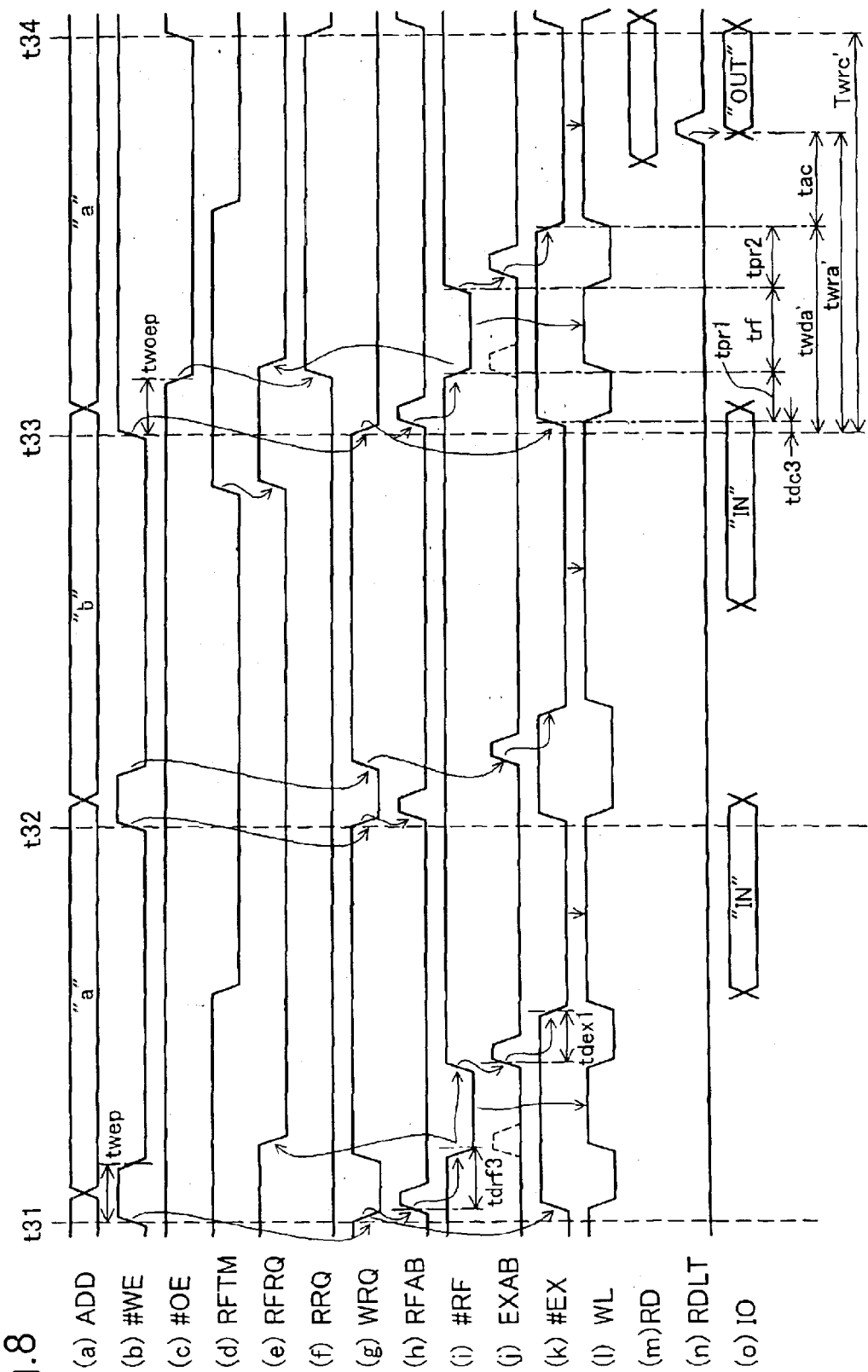
FIG. 8 shows the timing chart for each signal of a comparative example in the case where the read cycle is executed after the write cycle.

A comparative example is described to demonstrate the effect of the above described embodiment. FIG. 8 shows the timing chart for each signal of the comparative example in the case where the read cycle is executed after the write cycle.

The cycle between times t31 and t32 in FIG. 8 is the write cycle where the refreshing operation is executed. The cycle between times t32 and t33 is the write cycle where the refreshing operation is not executed. The cycle between times t33 and t34 is the read cycle where the refreshing operation is executed.

In the write cycle in the comparative example, the output enable signal #OE (indicated by the symbol (c) in FIG. 8) is at the level H (inactive). The write enable signal #WE (indicated by the symbol (b) in FIG. 8) changes to the level H (inactive) at the time of starting of each cycle and then goes back to the level L (active) at the expiration of a predetermined time period twep.

The cycle between times t31 and t32 is described hereinbelow. When the write enable signal #WE changes to the level H at the time t31, the write access requirement signal WRQ (indicated by the symbol (g) in FIG. 8) changes to the level L (inactive) consequently. When the write enable signal #WE changes to the level L after the expiration of the predetermined time period twep after the change of the write enable signal #WE to the level H, the write access requirement signal WRQ changes to the level H (active) consequently. The output enable signal #OE (indicated by the symbol (c) in FIG. 8) stays at the level H (inactive). Accordingly, the read access requirement signal RRQ (indicated by the symbol (f) in FIG. 8) also stays at the level L (inactive).

When the write access requirement signal WRQ changes to the level L, the external access execution timing signal

EX (indicated by the symbol (k) in FIG. 8) changes to the level H, if the external access execution timing signal #EX was at the level L in the preceding cycle. When the write access requirement signal WRQ changes to the level L, the refresh arbiter signal RFAB (indicated by the symbol (h) in FIG. 8) changes to the level H (active) consequently.

In the non-illustrated cycle before the time t31, the refresh timing signal RFTM (indicated by the symbol (d) in FIG. 8) has changed to the level H (active), and the refresh requirement signal RFRQ (indicated by the symbol (e) in FIG. 8) has also changed to the level H (active) consequently. If the refresh requirement signal RFRQ (indicated by the symbol (e) in FIG. 8) is at the level H when the refresh arbiter signal RFAB changes to the level H, the refresh execution timing signal #RF (indicated by the symbol (i) in FIG. 8) changes to the level L (active) at the expiration of a predetermined time period tdrf3 after the change of the refresh arbiter signal RFAB to the level H and stays at the level L for the predetermined time period trf. Consequently, a word line WL corresponding to a non-illustrated refresh address RADD (RAD8 through RAD19) is activated and the refreshing operation of the memory cell selected based on the word line WL is executed.

When the refresh execution timing signal #RF changes to the level L, the refresh requirement signal RFRQ (indicated by the symbol (e) in FIG. 8) changes to the level L (inactive), and the refresh requirement is released.

The predetermined time period tdrf3 is preferably determined so that the time period, from the time when the external access execution timing signal #EX changes to the level H to the time when the refresh execution timing signal #RF changes to the level L, becomes equal to or longer than the required pre-charge time. In other words, the predetermined time period tdrf3 is preferably determined so that the time period, from the time when the inactivation of the word line that has been activated in the read access operation starts to the time when the activation of the word line to be selected in the refreshing operation starts, becomes equal to or longer than the required pre-charge time.

In the case where the refreshing operation is not executed, when the write access requirement signal WRQ (indicated by the broken line with the symbol (g) in FIG. 8) changes to the level H, the external access arbiter signal EXAB (indicated by the broken line with the symbol (j) in FIG. 8) also changes to the level H consequently. However, in the case where the refreshing operation is executed, the change of the external access arbiter signal EXAB to the level H is masked because the refresh execution timing signal #RF changed to the level L when the refresh requirement signal RFRQ is at the level H. Then the external access arbiter signal EXAB (indicated by the symbol (j) in FIG. 8) changes to the level H after the refresh execution timing signal #RF returns to the level H.

When the external access arbiter signal EXAB changes to the level H, the external access execution timing signal #EX (indicated by the symbol (k) in FIG. 8) changes to the level L (active) consequently after the expiration of the predetermined time period tdex1 after the change of the external access arbiter signal EXAB to the level H. The external access execution timing signal #EX stays at the level L until the write access requirement signal WRQ changes to the level L according to the change of the write enable signal #WE to the level H at the time t32. When the external access execution timing signal #EX changes to the level L, a word line WL corresponding to the external address ADD (A0 through A19, indicated by the symbol "a") indicated by the symbol (a) in FIG. 8 is activated as shown by symbol (l) in FIG. 8.

Then the input data signal IO (IO0 through IO15) (indicated by the symbol (o) in FIG. 8) is written to the memory cell corresponding to the external address ADD (indicated by the symbol "a") at the timing of the change of the write enable signal #WE to the level H at the time t32.

The cycle between times t32 and t33 is described hereinbelow. In the cycle between times t32 and t33, the refresh requirement signal RFRQ stays at the level L (inactive) when the refresh arbiter signal RFAB changes to the level H. Accordingly, the refreshing operation is not executed. Consequently, the write enable signal #WE (indicated by the symbol (b) in FIG. 8) changes to the level H at the time t32, and then changes to the level L after expiration of the predetermined time period twep. Then the write access requirement signal WRQ (indicated by the symbol (g) in FIG. 8) changes to the level L. Then the external access arbiter signal EXAB (indicated by the symbol (j) in FIG. 8) changes to the level H according to the change of the write access requirement signal WRQ to the level H. When the external access arbiter signal EXAB changes to the level H, the external access execution timing signal #EX (indicated by the symbol (k) in FIG. 8) changes to the level L after the expiration of the predetermined time period tdex1 after the change of the external access arbiter signal EXAB to the level H. Consequently, the write access to the memory cell corresponding to the external address ADD (indicated by the symbol "b") is executed.

In the cycle between the times t33 and t34, the write enable signal #WE is at the level H (inactive), and the output enable signal #OE stays at the level L (active) from the time t33 for a predetermined time period twoep (generally, twoep≈twoep). Consequently, the read access is executed.

The refresh timing signal RFTM (indicated by the symbol (d) in FIG. 8) changes to the level H in the cycle between times t32 and t33. Consequently, the refresh requirement signal RFRQ (indicated by the symbol (e) in FIG. 8) changes to the level H. Accordingly, in the cycle between times t33 and t34, the refresh requirement signal RFRQ is at the level H, when the refresh arbiter signal RFAB (indicated by the symbol (h) in FIG. 8) changes to the level H. Consequently, in the cycle between times t33 and t34, the refreshing operation is executed after the execution of the read access operation as in the cycle between times t12 and t13 in FIG. 6.

The operation timings in the read cycle are the same as those of the cycle between times t12 and t13 in FIG. 6. Therefore, their explanation is omitted.

Where the starting time of the read access is fixed as the timing when the write enable signal #WE changes to the level H (inactive), the access time twra', from the starting time of the read access to the time when the output data signal IO is output, is similar to the formula (3) and is expressed with the following formula (9).

$$twra'=twda'+tac \quad (9)$$

The parameter twda' is a waiting time from the time when the write enable signal #WE changes to the level H to the time when the external access execution timing signal #EX changes to the level L. The parameter tac is a time period from the time when the external access execution timing signal #EX changes to the level L to the time when the output data signal IO is output. The waiting time twda' is expressed with the following formula (10).

$$twda'=tdc3+tpr1+trf+tpr2 \quad (10)$$

The parameter tdc3 shows a delay time of a logical circuit to generate the external access execution timing signal #EX.

The parameter tpr1 shows a time period from the change of the external access execution timing signal #EX to the level H to the change of the refresh execution timing signal #RF to the level L. The parameter trf shows a time period in which the refresh execution timing signal #RF stays at the level L. The parameter tpr2 shows a time period from the change of the refresh execution timing signal #RF to the level H to the change of the external access execution timing signal #EX to the level L.

C2.3 Comparison of Access Speed

The difference Δtwra between the access time twra of the embodiment expressed by the formula (7) and the access time twra' of the comparative example expressed by the formula (9) is expressed by the difference between the waiting time twda and the waiting time twda' as shown in the following formula (11).

$$\Delta twra = twda' - twda = (tddc2 + tpr1 + trf + tpr2) - (twoep + tdc1) \quad (11)$$

Generally, the lengths of the delay times tdc1 and tdc2 of the logical circuit can be considered to be the same, or can be ignored because the length of each delay time is much smaller than the other time periods. Thus, the formula (11) can be expressed by the following formula (11a).

$$\Delta twra = twda' - twda \approx (tpr1 + trf + tpr2) - twoep \quad (11a)$$

In the case where the time period twoep, from the change of the write enable signal #WE to the level H to the subsequent change of the output enable signal #OE to the level L, is sufficiently large, i.e., twoep>(tpr1+trf+tpr2), the waiting time twda' of the comparative example expressed by the formula (10) is nearly equal to the waiting time twda of the embodiment expressed by the formula (8), as was the case where the read cycles are executed in succession. In this case, the access time twra' of the comparative example is nearly equal to the access time twra of the embodiment expressed by the formula (7). Accordingly, the difference Δtwra is not produced.

However, as explained in the case where the read cycles are executed in succession, for a shortened cycle time, twoep in the comparative example is generally smaller than (tpr1+trf+tpr2), i.e., twoep<(tpr1+trf+tpr2).

Accordingly, the access time twra of the embodiment expressed by the formula (7) is smaller than the access time twra' of the comparative example expressed by the formula (9) by Δtwra expressed by the formula (11a). Consequently, the memory chip 10 of the embodiment achieves a fast read access in the case where the read cycle is executed after the write cycle. Furthermore, the memory chip 10 of the embodiment achieves a shortened cycle time in the case where the read cycle is executed after the write cycle.

In both the cases of: (1) Case where the read cycles are executed in succession; and (2) Case where the read cycle is executed after the write cycle, the embodiment achieves a faster read access than the comparative example, and achieves a shortened cycle time compared to the comparative example.

The time charts of each signal which were explained in the embodiments are examples and it is to be understood that the invention is not limited to the disclosed embodiments. In the read cycle, the external access controller may output the external access execution timing signal which changes to active immediately after the output enable signal changes to active, and changes to inactive immediately after the latch of the read signal starts by the change of the latch signal to inactive after the change to active. The refresh controller may output the refresh execution timing signal which changes to active and stays active for a predetermined time period according to the change of the latch signal to active while the refresh requirement signal is active.

In the write cycle, the refresh controller may output the refresh execution timing signal which changes to active for a predetermined time period according to the change of the write enable signal to active while the refresh requirement signal is active. The external access controller may output the external access execution timing signal which changes to active according to the change of the refresh execution timing signal back to inactive, and changes to inactive according to the change of the write enable signal back to inactive.

D. THE SECOND EXAMPLE

Figure 9:
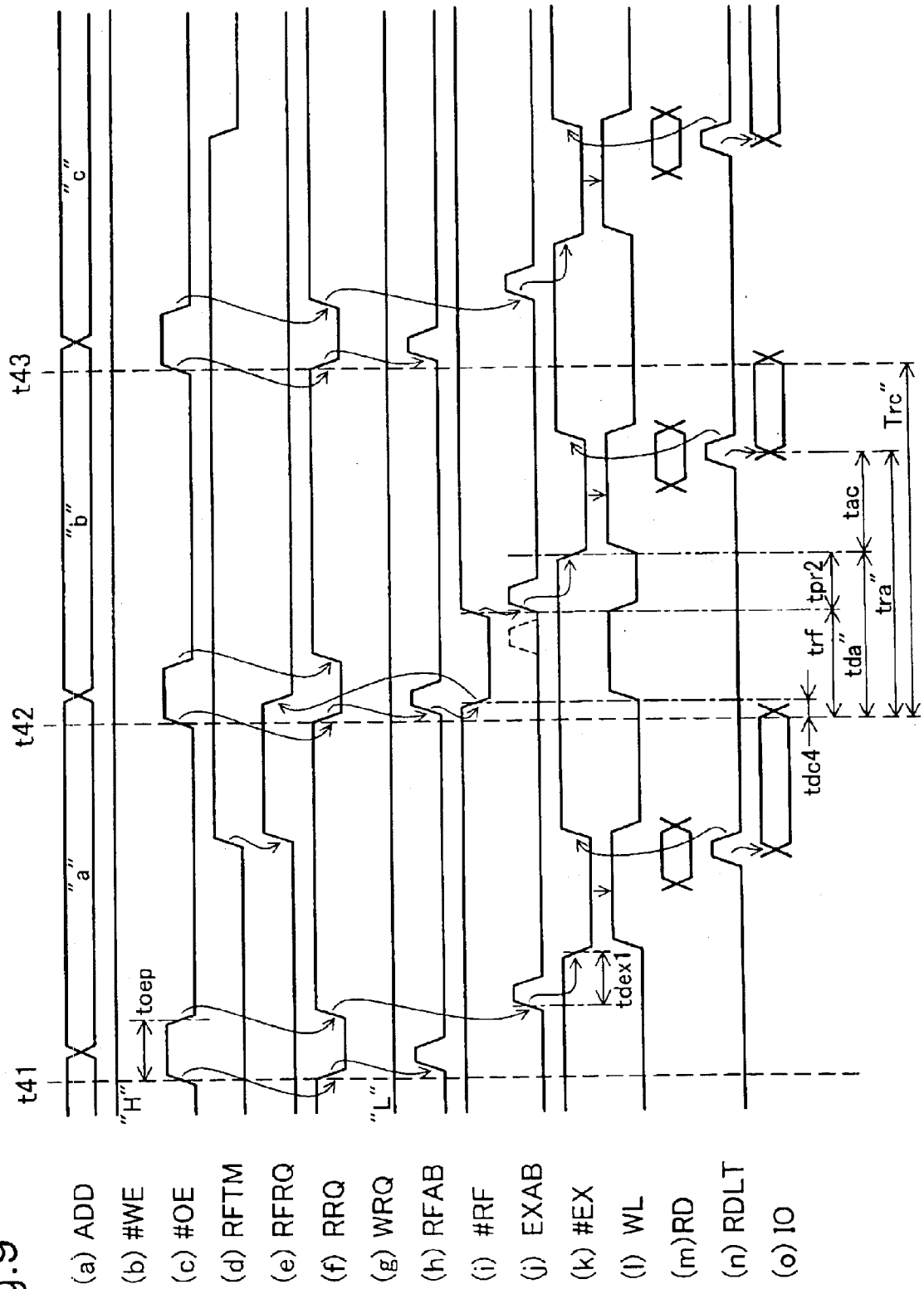
FIG. 9 shows the operations of the external access controller and the refresh controller of a second embodiment of the invention.

FIG. 9 shows the operations of the external access controller and the refresh controller of a second embodiment. FIG. 9 shows the timing chart for each signal in the case where the read cycles are executed in succession.

The cycle between times t41 and t42 in FIG. 9 is the cycle where the refreshing operation is not executed. The cycle between times t42 and t43 is the cycle where the refreshing operation is executed.

In the read cycle of the second embodiment, the write enable signal #WE (indicated by the symbol (b) in FIG. 9) is at the level H (inactive). The output enable signal #OE (indicated by the symbol (c) in FIG. 9) changes to the level H (inactive) at the time of starting of each cycle and then changes to the level L (active) at the expiration of a predetermined time period toep.

The cycle between times t41 and t42 is described hereinbelow. When the output enable signal #OE changes to the level H (inactive) at the time t41, the read access requirement signal RRQ (indicated by the symbol (f) in FIG. 9) changes to the level L (inactive) consequently.

When the read access requirement signal RRQ changes to the level L, the refresh arbiter signal RFAB (indicated by the symbol (h) in FIG. 9) changes to the level H (active) consequently. When the refresh arbiter signal RFAB changes to the level H, the refresh execution timing signal #RF (indicated by the symbol (i) in FIG. 9) stays at the level H (inactive), if the refresh requirement signal RFRQ (indicated by the symbol (e) in FIG. 9) is at the level L.

When the output enable signal #OE changes to the level L (active) after the expiration of the predetermined time period toep after the change of the output enable signal #OE to the level H, the read access requirement signal RRQ (indicated by the symbol (f) in FIG. 9) changes to the level H (active) consequently. The write access requirement signal WRQ (indicated by the symbol (g) in FIG. 9) varies synchronously with the write enable signal #WE. In this situation, the write enable signal #WE stays at the level H (inactive). Accordingly, the write access requirement signal WRQ also stays at the level L (inactive).

When the read access requirement signal RRQ changes to the level H, the external access arbiter signal EXAB (indicated by the symbol (j) in FIG. 9) changes to the level H (active) consequently. When the external access arbiter signal EXAB changes to the level H, the external access execution timing signal #EX (indicated by the symbol (k) in FIG. 9) changes to the level L (active) after the expiration of the predetermined time period tdex1 after the change of the external access arbiter signal EXAB to the level H.

When the external access execution timing signal #EX changes to the level L, a word line WL corresponding to the external address ADD (A0 through A19, indicated by the symbol "a") indicated by the symbol (a) in FIG. 9 is activated as shown by symbol (l) in FIG. 9, and the read signal RD (indicated by the symbol (m) in FIG. 9) is output.

At a specific timing when the read signal RD can be output stably, a pulse signal which changes to the level H according to the change of the external access execution timing signal #EX to the level L is output as the read latch signal RDLT (indicated by the symbol (n) in FIG. 9).

When the read latch signal RDLT changes to the level H and the latch of the read signal RD starts, the external access execution timing signal #EX (indicated by the symbol (k) in FIG. 9) changes to the level H (inactive) consequently. When the external access execution timing signal #EX changes to the level H, the word line WL that has been activated is inactivated and reading from the selected memory cell ends. However, the read signal RD has already been latched. Accordingly, the latched read signal RD is output as an output data signal IO (IO0 through IO15) (indicated by the symbol (o) in FIG. 9) for a time period in which the output enable signal #OE stays at the level L. Based on the signal, the read access to the memory cell corresponding to the external address ADD (indicated by the symbol "a") is executed.

The cycle between times t42 and t43 is described hereinbelow. The refresh timing signal RFTM (indicated by the symbol (d) in FIG. 9) changes to the level H in the cycle between times t41 and t42. Consequently, the refresh requirement signal RFRQ (indicated by the symbol (e) in FIG. 9) changes to the level H. Accordingly, in the cycle between times t42 and t43, the refresh requirement signal RFRQ is at the level H, when the refresh arbiter signal RFAB changes to the level H. The refresh execution timing signal #RF (indicated by the symbol (i) in FIG. 9) changes to the level L (active) according to the change of the refresh arbiter signal RFAB to the level H. Then the refresh execution timing signal #RF stays at the level L for the predetermined time period trf Consequently, a word line WL corresponding to a non-illustrated refresh address RADD (RAD8 through RAD19) is activated and the refreshing operation of the memory cell selected based on the word line WL is executed.

When the refresh execution timing signal #RF changes to the level L, the refresh requirement signal RFRQ (indicated by the symbol (e) in FIG. 9) changes to the level L (inactive), and the refresh requirement is released.

In the case where the refreshing operation is not executed in the cycle between the times t41 and t42, when the read access requirement signal RRQ changes to the level H according to the change of the output enable signal #OE to the level L, the external access arbiter signal EXAB (indicated by the broken line with the symbol (j) in FIG. 9) changes to the level H consequently. However, in the case where the refreshing operation is executed, the change of the external access arbiter signal EXAB to the level H is masked because the refresh execution timing signal #RF changed to the level L when the refresh requirement signal RFRQ is at the level H. Then the external access arbiter signal EXAB (indicated by the symbol (j) in FIG. 9) changes to the level H after the refresh execution timing signal #RF returns to the level H.

When the external access arbiter signal EXAB changes to the level H, the external access execution timing signal #EX (indicated by the symbol (k) in FIG. 9) changes to the level L (active) after the expiration of the predetermined time period tdex1 after the change of the external access arbiter signal EXAB to the level H. When the external access FIG. execution timing signal #EX changes to the level L, a word line WL corresponding to the external address ADD (A0 through A19, indicated by the symbol "b") indicated by the symbol (a) in FIG. 9 is activated as shown by symbol (l) in FIG. 9, and the read signal RD (indicated by the symbol (m) in FIG. 9) is output. Due to the read signal RD, the read access to the memory cell corresponding to the external address ADD (indicated by the symbol "b") is executed.

The predetermined time period tdex1 is preferably determined so that the time period, from the time when the refresh execution timing signal #RF changes to the level H to the time when the external access execution timing signal #EX changes to the level L, becomes equal to or longer than the required pre-charge time.

In the comparative shown in FIG. 6, the refresh execution timing signal #RF changes to the level L at the expiration of the predetermined time period tdrf2 after the change of the refresh arbiter signal RFAB to the level H. The purpose of this setting is to make the time period, from the time when the inactivation of the word line that has been activated starts to the time when the activation of the word line to be selected in the refreshing operation starts, equal to or longer than the required pre-charge time. However, in the second embodiment, the external access execution timing signal #EX changes to the level H (inactive) at the time when the latch of the read signal RD starts, and the read operation from the memory cell ends at that time. Accordingly, the required pre-charge time can be acquired in the time period before the output enable signal #OE changes to the level H and the next cycle starts. Consequently, the delay time tdrf2, from the change of the refresh arbiter signal RFAB to the level H to the change of the refresh execution timing signal #RF to the level L in the comparative example, is not required in the second embodiment.

Where the starting time of the read access is fixed as the timing when the output enable signal #OE changes to the level H (inactive), the access time tra", from the starting time of the read access to the time when the output data signal IO is output, is expressed with the following formula (12).

$$tra" = tda" + tac \quad (12)$$

The parameter tda" is a waiting time from the time when the output enable signal #OE changes to the level H to the time when the external access execution timing signal #EX changes to the level L. The parameter tac is a time period from the time when the external access execution timing signal #EX changes to the level L to the time when the output data signal IO is output. The waiting time tda" is expressed with the following formula (13).

$$tda" = tdc4 + trf + tpr2 \quad (13)$$

The parameter tdc4 shows a delay time of a logical circuit to generate the external access execution timing signal #EX. The parameter trf shows a time period in which the refresh execution timing signal #RF stays at the level L. The parameter tpr2 shows a time period from the change of the refresh execution timing signal #RF to the level H to the change of the external access execution timing signal #EX to the level L.

The difference Δtra" between the access time tra" of the embodiment expressed by the formula (12) and the access time tra' of the comparative example expressed by the formula (3) is expressed by the difference between the waiting time tda" and the waiting time tda' as shown in the following formula (14).

$$\Delta tra" = tda' - tda" = (tdc2 + tpr1 + trf + tpr2) - (tdc4 + trf + tpr2) = (tdc2 + tpr1) - tdc4 \quad (14)$$

Generally, the lengths of the delay times tdc2 and tdc4 of the logical circuit can be considered to be the same, or can be ignored because the length of each delay time is much smaller than the other time periods. Thus, the formula (14) can be expressed by the following formula (14a).

$$\Delta tra" = tda' - tda" \approx tpr1 \quad (14a)$$

Accordingly, the access time tra" of the embodiment expressed by the formula (12) is smaller than the access time tra' of the comparative example expressed by the formula (3) by Δtra" expressed by the formula (14a). Consequently, the memory chip 10 of the embodiment achieves a fast read access in the case where the read cycles are executed in succession. Furthermore, the memory chip 10 of the embodiment achieves a shortened cycle time in the case where the read cycles are executed in succession.

As described above, the second embodiment achieves a faster read access than the comparative example in the case where the read cycles are executed in succession, and achieves a shortened cycle time compared to the comparative example.

The time charts of each signal which are explained in the embodiments are examples and it is to be understood that the invention is not limited to the disclosed embodiments. In the read cycle, the external access controller may output the external access execution timing signal which changes to active according to the change of the output enable signal to active, and changes to inactive when the latch of the read signal starts by the change of the latch signal to inactive after the change to active. The refresh controller may output the refresh execution timing signal which changes to active and stays active for a predetermined time period according to the change of the output enable signal to inactive while the refresh requirement signal is active.

E. Application to Electrical Apparatus

Figure 10:
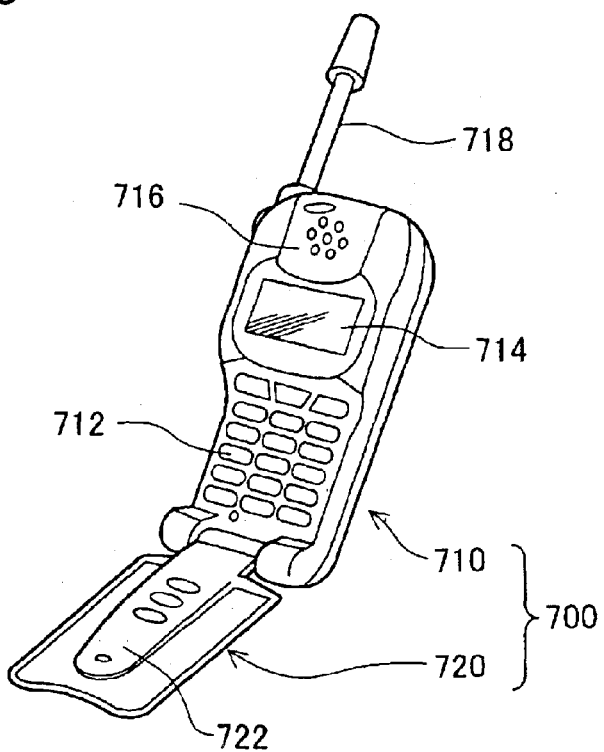
FIG. 10 is a perspective view illustrating a cellular phone as one application of a semiconductor memory device of the present invention to an electronic apparatus.

FIG. 10 is a perspective view illustrating a cellular phone as one application of a semiconductor memory device of the present invention to an electronic apparatus. The cellular phone 700 has a main body 710 and a cover member 720. The main body 710 has a keyboard 712, a liquid crystal display 714, a receiver module 716, and an antenna module 718. The cover member 720 has a microphone module 722.

Figure 11:
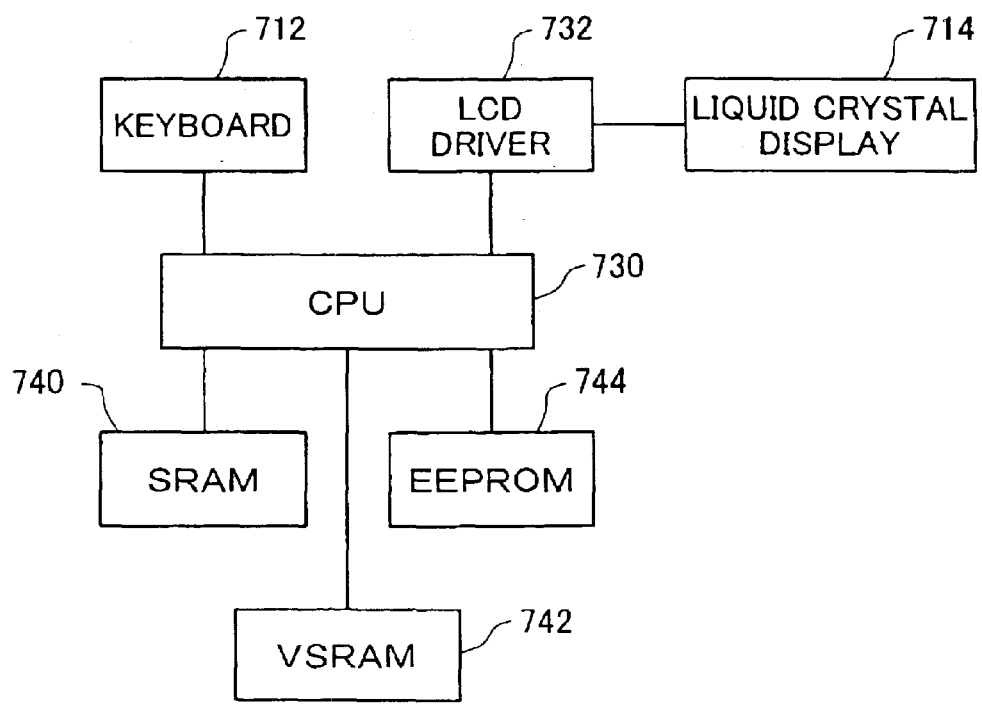
FIG. 11 is a block diagram illustrating the electrical construction of the cellular phone shown in FIG. 10.

FIG. 11 is a block diagram illustrating the electrical construction of the cellular phone 700 shown in FIG. 10. A CPU 730 is connected to the keyboard 712, an LCD driver 732 for actuating the liquid crystal display 714, a SRAM 740, a VSRAM 742, and an EEPROM 744 via bus lines.

The SRAM 740 is used, for example, as a high-speed cache memory. The VSRAM 742 is used, for example, as a working memory for image processing. The memory chip 10 described above is applicable for the VSRAM (virtual SRAM or pseudo SRAM) 742. The EEPROM 744 is used to store various settings of the cellular phone 700.

The VSRAM 742 is kept in the snooze state to pause the operations of the cellular phone 700. In this state, the VSRAM 742 automatically carries out internal refresh, so that data in the VSRAM 742 can be held. The memory chip 10 of the embodiment has a relatively large capacity and thus advantageously holds a mass of data, such as image data, for a long time period.

While the invention has been described with reference to preferred exemplary embodiments thereof, it is to be understood that the invention is not limited to the disclosed embodiments or constructions. On the contrary, the invention is intended to cover various modifications and equivalent arrangements. In addition, while the various elements of the disclosed invention are shown in various combinations and configurations, which are exemplary, other combinations and configurations, including more less or only a single element, are also within the spirit and scope of the invention.

What is claimed is:

1. A semiconductor memory device, comprising:
a memory cell array of dynamic memory cells;
an external access controller which outputs an external access execution timing signal for indicating an execution timing of an access operation to the memory cell array; and
a refresh controller which outputs a refresh execution timing signal for indicating an execution timing of a refreshing operation to the memory cell array, wherein
an output enable signal supplied from an external device changes to active in a read cycle;
a latch signal changes to active and then inactive to indicate latching of a read signal which is read from the memory cell array;
in the read cycle, the external access execution timing signal
changes to active triggered by the change of the output enable signal to active; and
changes to inactive triggered by a start of a latch of the read signal caused by changes of the latch signal to active and inactive;
a refresh requirement signal changes to active to instruct an execution of the refreshing operation to the memory cell array; and
in the read cycle, the refresh execution timing signal
changes to active according to the change of the latch signal to active while the refresh requirement signal is active; and
stays active for a predetermined time period.

2. The semiconductor memory device according to claim 1, wherein
a write enable signal supplied from an external device changes to active in a write cycle;
in the write cycle, the refresh execution timing signal
changes to active according to a change of the write enable signal to active while the refresh requirement signal is active; and
stays active for the predetermined time period; in the write cycle, the external access execution timing signal
changes to active according to a change of the refresh execution timing signal to inactive; and
changes to inactive according to the change of the write enable signal to inactive.

3. A semiconductor memory device, comprising:
a memory cell array of dynamic memory cells;
an external access controller which outputs an external access execution timing signal for indicating an execution timing of an access operation to the memory cell array; and
a refresh controller which outputs a refresh execution timing signal for indicating an execution timing of a refreshing operation to the memory cell array, wherein
an output enable signal supplied from an external device changes to active in a read cycle;
a latch signal changes to active and then inactive to indicate latching of a read signal which is read from the memory cell array;
in the read cycle, the external access execution timing signal
changes to active according to the change of the output enable signal to active; and
changes to inactive according to a start of a latch of the read signal after changes of the latch signal to active and inactive;
a refresh requirement signal changes to active to instruct an execution of the refreshing operation to the memory cell array; and
in the read cycle, the refresh execution timing signal
changes to active according to the change of the output enable signal to inactive while the refresh requirement signal is active; and
stays active for a predetermined time period.

* * * * *